United States Patent
Matsuoka et al.

(10) Patent No.: US 7,997,813 B2
(45) Date of Patent: Aug. 16, 2011

(54) COATING AND DEVELOPING SYSTEM WITH A DIRECT CARRYING DEVICE IN A PROCESSING BLOCK, COATING AND DEVELOPING METHOD AND STORAGE MEDIUM

(75) Inventors: Nobuaki Matsuoka, Koshi (JP); Takahiro Hashimoto, Koshi (JP); Katsuhiro Tsuchiya, Tokyo-to (JP); Shinichi Hayashi, Koshi (JP); Yasushi Hayashida, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 497 days.

(21) Appl. No.: 12/057,846

(22) Filed: Mar. 28, 2008

(65) Prior Publication Data
US 2008/0241402 A1    Oct. 2, 2008

(30) Foreign Application Priority Data

Mar. 30, 2007   (JP) .................................. 2007-095743

(51) Int. Cl.
*G03D 5/04* (2006.01)
(52) U.S. Cl. ...................................................... 396/611
(58) Field of Classification Search .................. None
See application file for complete search history.

(56) References Cited

U.S. PATENT DOCUMENTS

| | | | |
|---|---|---|---|
| 6,799,910 B2 * | 10/2004 | Tateyama | 396/611 |
| 7,267,497 B2 | 9/2007 | Akimoto et al. | |
| 7,403,260 B2 | 7/2008 | Matsuoka et al. | |
| 7,474,377 B2 | 1/2009 | Matsuoka et al. | |
| 7,793,609 B2 * | 9/2010 | Akimoto et al. | 118/52 |
| 2005/0141891 A1 * | 6/2005 | Tanaka et al. | 396/611 |
| 2006/0165408 A1 | 7/2006 | Akimoto et al. | |
| 2006/0201615 A1 * | 9/2006 | Matsuoka et al. | 156/272.2 |
| 2007/0117400 A1 * | 5/2007 | Matsuoka et al. | 438/758 |
| 2007/0186850 A1 | 8/2007 | Matsuoka et al. | |
| 2007/0253710 A1 * | 11/2007 | Kaneyama et al. | 396/611 |

FOREIGN PATENT DOCUMENTS

| | | |
|---|---|---|
| JP | 2005-203635 | 7/2005 |
| JP | 2006-203075 | 8/2006 |
| JP | 2006-287178 | 10/2006 |

* cited by examiner

*Primary Examiner* — Clayton E Laballe
*Assistant Examiner* — Bret Adams
(74) *Attorney, Agent, or Firm* — Oblon, Spivak, McClelland, Maier & Neustadt, L.L.P.

(57) ABSTRACT

A coating and developing system includes processing blocks of the same construction each built by stacking up a plurality of unit blocks including a film forming unit block and a developing unit block in layers. The processing blocks are arranged longitudinally between a carrier block and an interface block. The number of processing blocks like the processing blocks arranged between the carrier block and the interface block is adjusted to adjust the throughput of the coating and developing system. Thus, a coating and developing system capable of achieving a desired throughput can be easily designed and manufactured.

5 Claims, 10 Drawing Sheets

COATING AND DEVELOPING SYSTEM WITH A DIRECT CARRYING DEVICE IN A PROCESSING BLOCK, COATING AND DEVELOPING METHOD AND STORAGE MEDIUM

BACKGROUND OF THE INVENTION

1. Field of the Invention

The present invention relates to a coating and developing system for coating a substrate, such as a semiconductor wafer or an LCD substrate, namely, a glass substrate for a liquid crystal display, with a resist solution by a coating process and processing the substrate by a developing process after exposure, a coating and developing method to be carried out by the coating and developing system, and a storage medium.

2. Description of the Related Art

A manufacturing process for manufacturing a semiconductor device or an LCD substrate forms a resist patter on a substrate by photolithography. Photolithography includes a series of steps of coating a surface of a substrate, such as a semiconductor wafer (hereinafter, referred to as "wafer") with a resist film by applying a resist solution to the surface, exposing the resist film to light through a photomask, and processing the exposed resist film by a developing process to form a desired pattern.

Generally, those processes are carried out by a resist pattern forming system constructed by connecting an exposure system to a coating and developing system for coating a surface of a substrate with a resist solution and developing an exposed film. Such a resist pattern forming system is proposed in, for example, JP-A 2006-203075. In such a coating and developing system, an area in which modules for processing a substrate before the substrate is subjected to an exposure process, and an area in which modules for processing the substrate processed by the exposure system are vertically arranged in layers to further increase the processing rate of the coating and developing system, carrying devices are installed respectively in those areas to improve carrying efficiency by reducing load on the carrying devices so that the throughput of the coating and developing system may be increased.

As shown in FIG. 10 by way of example, this coating and developing system has developing blocks B1 and B2 that carry out a developing process, a coating block B4 that carries out a coating process for coating a wafer W with a resist solution, and antireflection film forming blocks B3 and B5 that form antireflection films before and after the application of the resist solution to the wafer W. The developing blocks B1 and B2, the antireflection film forming block B3, the coating block B4 and the antireflection film forming block B5 are stacked up in that order. The blocks B1 to B5 are provided with shelf units built by stacking up wet-processing units that carry out wet processes, such as coating solution application processes for applying chemical solutions to a wafer W for a developing process, a resist solution application process and an antireflection film forming process, and processing units that carry out processes before and after the wet process in layers, respectively, carrying devices A1 to A5 that carry a wafer W to and from the wet-processing units and the parts of the shelf units, and a transfer arm for transferring a wafer W to and from the blocks B1 to B5. The wet-processing unit has, for example, three wet-processing devices. The processing units include a necessary number of necessary types of units. Loads on the carrying devices A1 to A5 and the transfer arm are reduced to improve the throughput of the coating and developing system.

Such a coating and developing system can achieve a throughput of, for example, on the order of 180 wafers/hr. In some cases, a desired throughput is dependent on an intended process. In some cases a system capable of processing wafers at a high throughput in the range of 200 to 250 wafers/hr exceeding a throughput that can be achieved by the current systems is demanded, and in other cases, a system capable of processing wafers at a very high throughput is not demanded.

The throughput of the foregoing system may be improved by increasing the number of the wet-processing units of the developing blocks B1 and B2, the coating block B4 and the processing units. Such construction increases loads on the carrying devices A1 to A5, reduces carrying efficiency and hence it is difficult to improve the throughput of the system. If the number of the units of the blocks B1 to B5 is adjusted to achieve a desired throughput, the number of the units is dependent on the throughput. Therefore, many different types of systems respectively having different numbers of units need to be manufactured according to the demand of users, which increases loads on work for designing and manufacture.

The numbers of the wet-processing units and that of processing units may be increased by increasing the number of the blocks including the developing blocks B1 and B2 stacked in layers. However, a carrying in which the transfer arm carries a wafer W to and from the blocks extends vertically and the number of cycles of a transfer operation for transferring a wafer W to and receiving a wafer W from the blocks increases if the number of the layers of the blocks is increased. Consequently, load on the transfer arm increases and it is difficult to improve the throughput of the system. To cope with the change of the through put, the number of the layers of the blocks needs to be changed, the carrying range of the transfer arm needs to be changed and hence many types of systems needs to be manufactured. Likewise, it is difficult to reduce loads on work for designing and manufacture.

SUMMARY OF THE INVENTION

The present invention has been made under such circumstances and it is therefore an object of the present invention to provide techniques facilitating designing and manufacturing a coating and developing system capable of achieving a desired throughput.

A coating and developing system according to the present invention, for forming films including a resist film on a substrate carried in a carrier delivered to a carrier block by film forming unit blocks, carrying the substrate through an interface block to an exposure system, processing the substrate processed by an exposure process and returned through the interface block from the exposure system by a developing process, transferring the substrate processed by the developing process to the carrier block, each of film forming unit blocks and developing unit blocks including a wet-processing module for applying a chemical solution to a substrate, a heating module for heating a substrate, a cooling module for cooling a substrate, substrate carrying means for carrying a substrate to and from those modules, includes: a processing station provided with at least two processing blocks of the same construction each built by stacking up a plurality of unit blocks including a film forming unit block and a developing unit block, arranged longitudinally contiguously between the carrier block on a front side and the interface block on a back side along a substrate carrying passage along which a substrate is carried backward from the carrier block toward the interface block; transfer unit blocks disposed in the processing blocks, respectively, on the front side of the unit blocks, each built by stacking up, in layers, transfer units so as to correspond to the unit blocks, respectively, to transfer a substrate from one to another of the unit blocks therethrough by transferring a substrate to and receiving a substrate from substrate carrying means included in the unit blocks; vertically movable transfer arms installed in the processing blocks, respectively, to carry a substrate to and from the transfer units of the transfer unit blocks; inlet and outlet transfer units, included in the transfer unit blocks, for transferring a substrate between the carrier block and the processing block or between the adjacent ones of the processing blocks, and capable of transferring a substrate to and receiving a substrate from the transfer arms, respectively; and direct carrying means installed in each of the processing blocks to carry a substrate exclusively between the inlet and outlet transfer unit of the processing block and that of the processing block on the back side and adjacent to the former processing block.

"Processing blocks of the same construction" are those respectively provided with the film forming unit blocks and the developing unit blocks for forming the same type of a film, the respective numbers of the unit blocks are the same, and the coating unit blocks and the developing unit blocks are the same in construction.

Desirably, the coating and developing system includes a controller for controlling the substrate carrying means, the direct carrying means and the transfer arms such that a substrate is carried from the carrier block directly to the inlet and outlet transfer unit of the processing block that forms a film on the substrate or by the direct carrying means of the processing block on the front side of the former processing block, the substrate is carried from the inlet and outlet transfer unit to the film forming unit block of the processing block by the transfer arm and the substrate carrying means, the substrate on which a film has been formed is carried to the inlet and outlet transfer unit of the processing block, the substrate is carried from the inlet and outlet transfer unit to the interface block by the direct carrying means of the same processing block or by the direct carrying means of the processing block on the back side of the former processing block, the substrate processed by an exposure process is carried from the interface block to the inlet and outlet transfer unit of the processing block that processes the substrate by a developing process by the direct carrying means of the same processing block or by the direct carrying means of the same processing block and the processing block on the back side of the former processing block, and the substrate is carried from the inlet and outlet transfer unit to the developing unit block of the processing block by the transfer arm and the substrate carrying means.

A coating and developing method according to the present invention, to be carried out by a coating and developing system including a processing station provided with at least two processing blocks of the same construction built by stacking up a plurality of unit blocks including a film forming unit block and a developing unit block, arranged longitudinally contiguously between a carrier block on a front side and an interface block on a back side along a substrate carrying passage along which a substrate is carried backward from the carrier block toward the interface block, for forming films including a resist film on a substrate carried in a carrier delivered to the carrier block by film forming unit blocks, carrying the substrate through the interface block to an exposure system after forming films including a resist film on the substrate, processing the substrate returned through the interface block from the exposure system by a developing process by the developing unit block, and transferring the substrate processed by the developing process to the carrier block, includes the steps of: transferring a substrate from the carrier block directly to an inlet and outlet transfer unit included in the processing block that forms films or by a direct carrying means included in the processing block on the front side of the former processing block; carrying the substrate from the inlet and outlet transfer unit to the film forming unit block of the processing block by a transfer arm and a substrate carrying means; carrying the substrate on which films have been formed to the inlet and outlet transfer unit of the processing block; carrying the substrate from the inlet and outlet transfer unit to the interface block by a direct carrying means included in the processing block or by a direct carrying means included in the processing block on the back side of the former processing block; carrying the substrate processed by an exposure process from the interface block to the inlet and outlet transfer unit included in the processing block that processes the substrate by a developing process by a direct carrying means included in the same processing block or by direct carrying means included in the same processing block and the processing block on the back side of the former processing block; and carrying the substrate from the inlet and outlet transfer unit to a developing unit block included in the processing block by a transfer arm and the substrate carrying means.

A storage medium according to the present invention stores a computer program to be carried out by a coating and developing system that forms films including a resist film on a substrate received from a carrier block and processes the substrate processed by an exposure process by a developing process; wherein the program includes a set of instructions specifying the steps of the coating and developing method according to the present invention.

According to the present invention, the processing blocks of the same construction are arranged between the carrier block and the interface block, and the processing rate of the coating and developing system is adjusted by adjusting the number of the processing blocks. Thus a coating and developing system capable of achieving a desired throughput can be easily designed and manufactured

DESCRIPTION OF THE PREFERRED EMBODIMENTS

Figure 1:
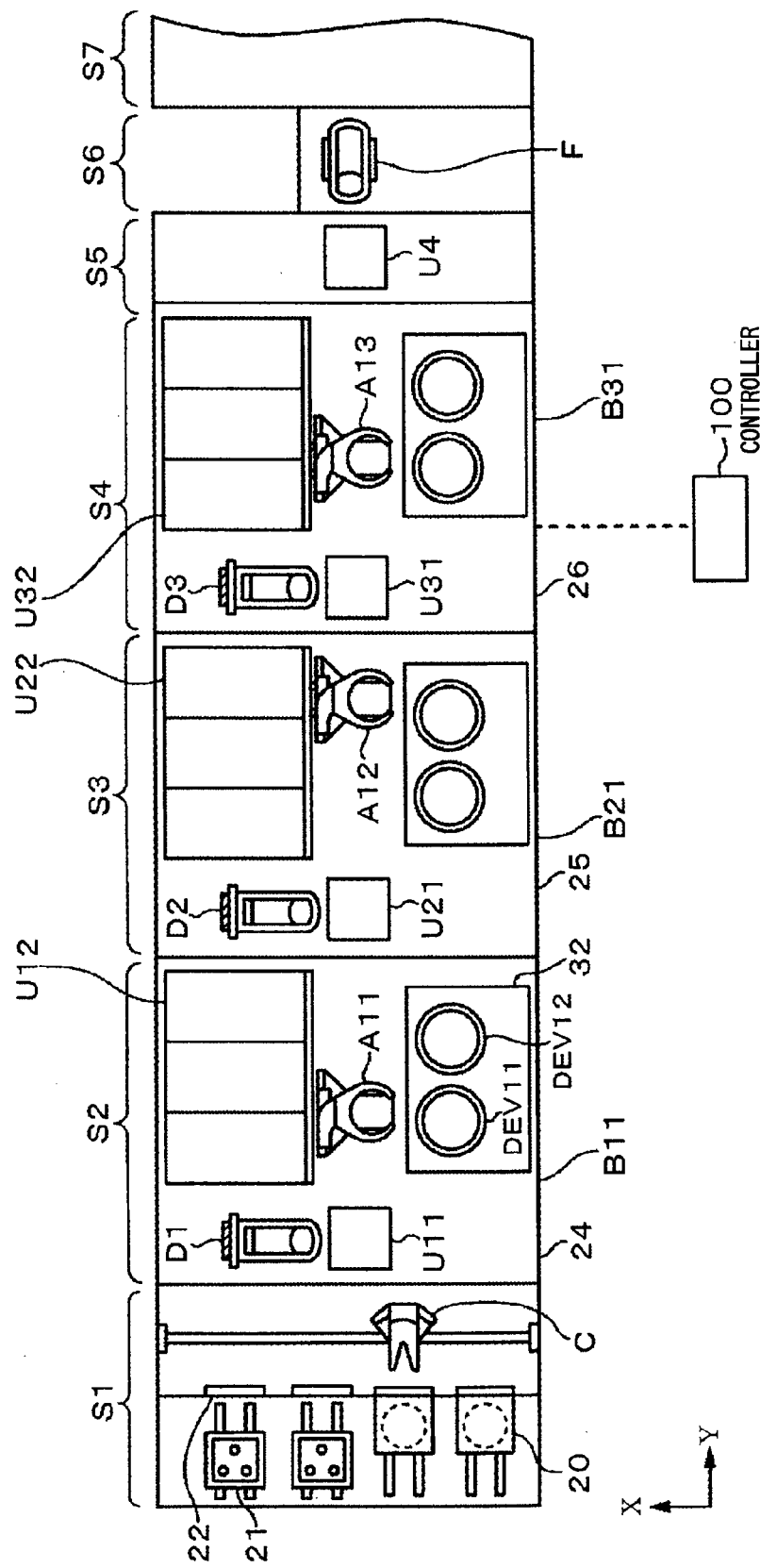
FIG. 1 is a plan view of a coating and developing system in a first embodiment according to the present invention.
Figure 2:
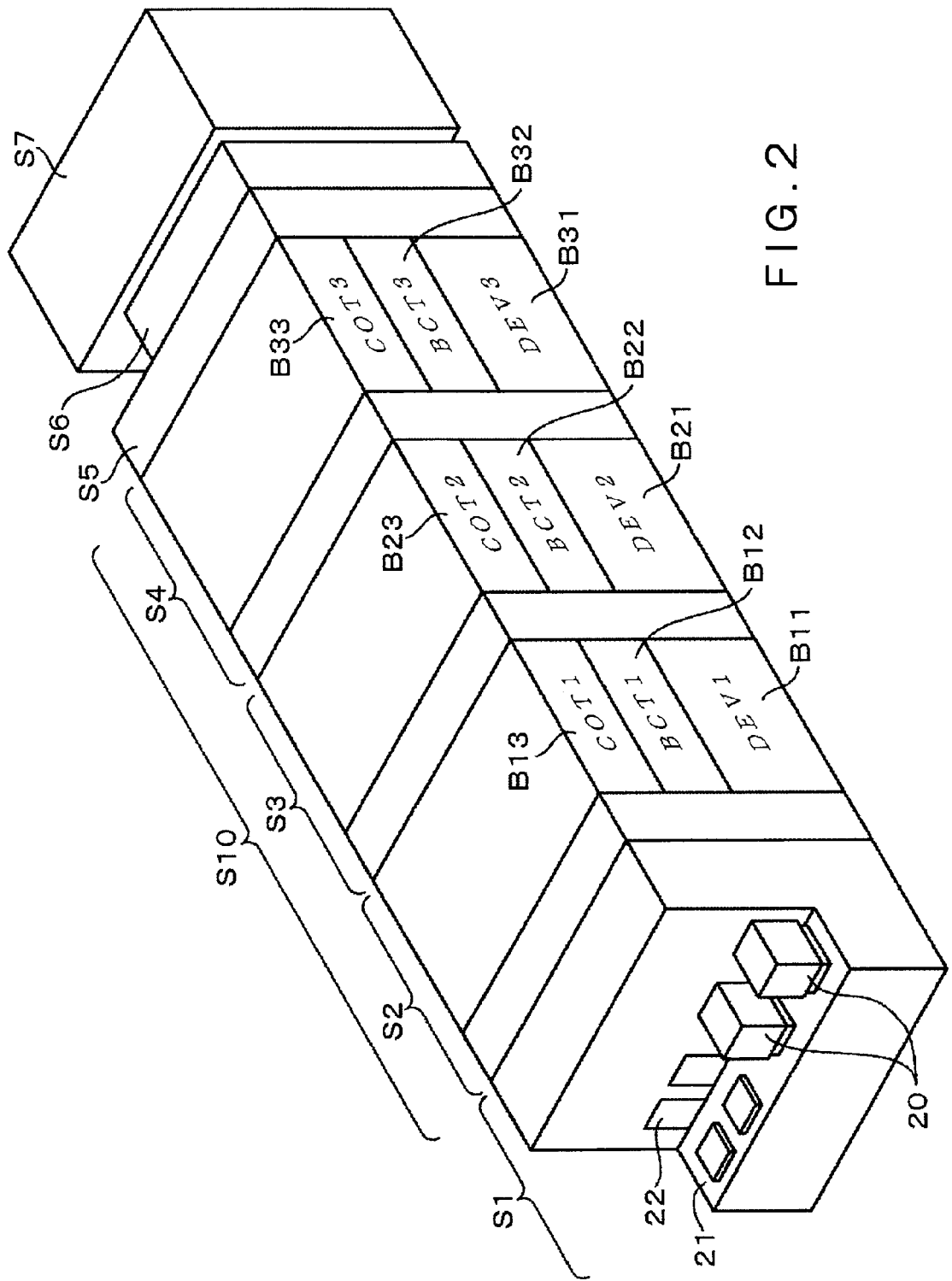
FIG. 2 is a perspective view of the coating and developing system in the first embodiment.
Figure 3:
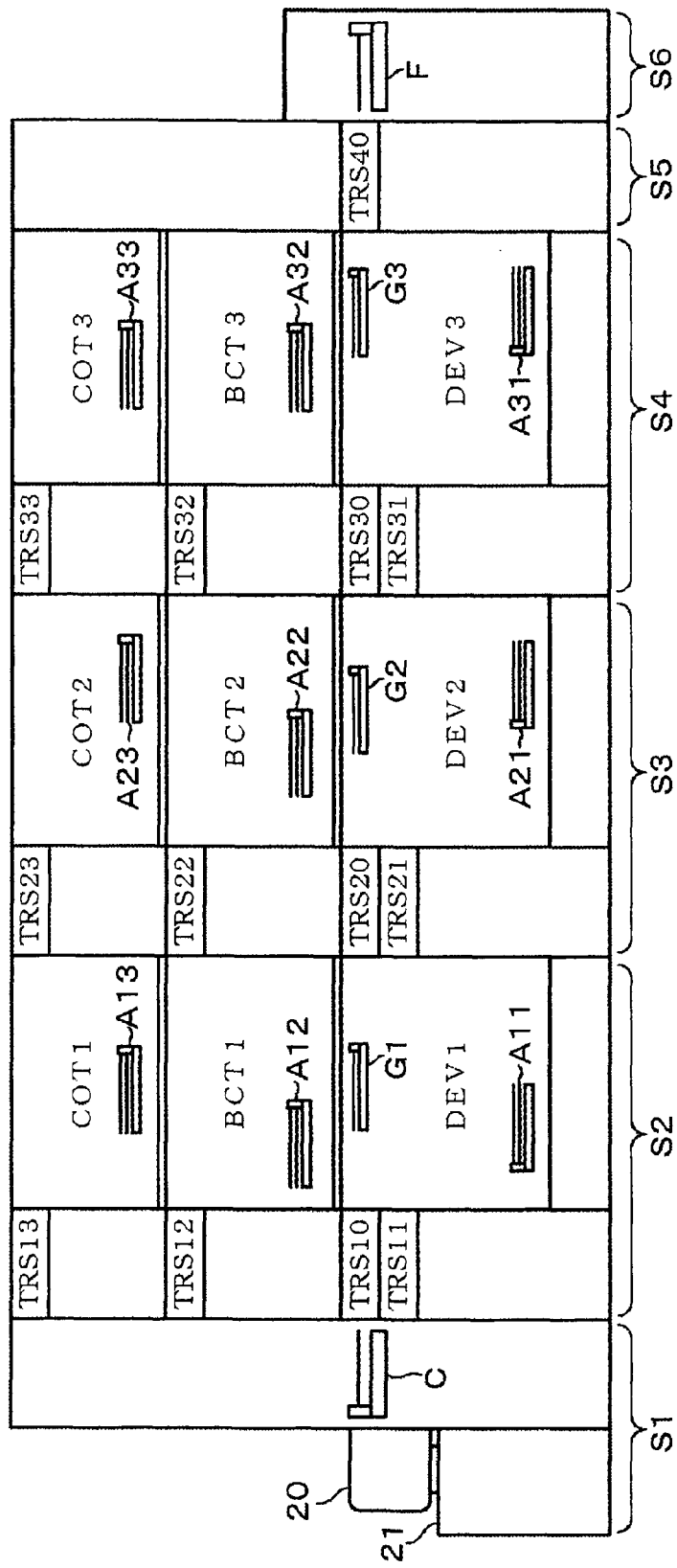
FIG. 3 is a sectional side elevation of the coating and developing system in the first embodiment.

Resist pattern forming systems in preferred embodiments of a coating and developing system according to the present invention will be described with reference to the accompanying drawings. FIGS. 1, 2 and 3 are a plan view, a schematic perspective view and a schematic side elevation, respectively, of a resist pattern forming system in a first embodiment according to the present invention. The resist pattern forming system has a carrier block S1, a processing station S10, a transfer block S5, an interface block S6, and an exposure system S7. The carrier block S1 is on the front side, and the interface block S6 is on the back side. The carrier block S1, the processing station S10, the transfer block S5, the interface block S6, and the exposure system S7 are arranged longitudinally in that order in a line, and the adjacent ones thereof are connected.

The carrier block S1 receives and sends out a carrier 20 containing, for example, thirteen wafers W, namely, substrates, in an airtight fashion. The carrier block S1 is provided with a carrier platform 21 on which a plurality of carriers 20 are supported, a wall disposed behind the carrier platform 21 and provided with closable openings 22, and a transfer arm C, namely, a transfer means, for taking out a wafer W from the carrier 20 through the closable opening 22. The transfer arm C can move in longitudinal and vertical directions, can turn about a vertical axis, and can move laterally along a direction in which carriers 20 are arranged to carry a wafer W to and receive a wafer W from transfer modules TRS10 and TRS11 included in a first processing block S2.

The processing station S10 is disposed behind and joined to the carrier block S1. The processing station S10 has at least two processing blocks of the same construction longitudinally arranged along a carrying route, along which a wafer W is carried, extending from the side of the carrier block S1 toward the interface block S6. In this embodiment, the processing station S10 has a first processing block S2, a second processing block S3, and a third processing block S4. The number of the processing blocks of the processing station S10 is determined selectively according to a desired throughput.

The processing blocks S2 to S4 are the same in construction and hence the first processing block S2 will be described by way of example. The first processing block S2 is surrounded by a box 24 and is built by stacking, for example, three unit blocks B11, B12 and B13 in that order in a vertical arrangement. In this embodiment, the unit block B11 is a developing layer (DEV1 layer) B11 for carrying out a developing process, the unit block B12 is an antireflection film forming layer (BCT1 layer) B12 for forming an antireflection film underlying a resist film, and the unit block B13 is a film forming layer (COT1 layer) B13 for forming a resist film.

The unit blocks B11, B12 and B13 are similar in construction. Each of the unit blocks B11, B12 and B13 is provided with wet-processing modules for applying a solution to a wafer W, various processing modules for processing a wafer W by a pretreatment before the wafer W is processed by the wet-processing module and processing the wafer W processed by the wet-processing module by a posttreatment, and main arms A11 to A13, namely, substrate carrying means, for carrying a wafer W to and from the wet-processing module, and the various processing modules.

As shown in FIGS. 1 and 3, a transfer shelf unit U11 is disposed in an area near the carrier block S1 in the first processing block S2. The transfer arm C and the main arms A11 to A13 can gain access to the transfer shelf unit U11. The transfer shelf unit U11 has transfer units respectively for each of the unit blocks B11 to B13. A wafer W is transferred to and from the other unit blocks B11 to B13. The shelf unit U11 is a transfer unit assemblage having transfer units arranged in layers.

A transfer arm D1 capable of moving in longitudinal and vertical directions can access the transfer units of a shelf unit U11. The transfer arm D1 carries a wafer W to and receives a wafer W from the transfer units of the transfer shelf unit U11, and the other unit blocks.

The construction of the COT1 layer B13 will be described as an example of that of the unit blocks B11 to B13 with reference to FIGS. 4 and 5. A carrying area R1 in which a wafer W is carried extends longitudinally, namely, in a Y-direction in FIGS. 4 and 5, in a substantially central part of the COT1 layer B13. A coating unit 31 for coating a surface of a wafer W with a resist solution is disposed on the right-hand side, as viewed from the side of the carrier block S1, of the carrying area R1.

In the coating unit 31, a plurality of, for example, two coating modules COT11 and COT12 are arranged along the Y-direction in a processing vessel 30 so as to face the carrying area R1. Each of the coating modules COT11 and COT12 pours a resist solution, namely, a coating solution, through a common pouring nozzle onto a wafer W held by suction in a horizontal position on, for example, a spin chuck, spreads the resist solution over the surface of the wafer W by rotating the wafer W to coat the surface of the wafer W with a resist solution film. The processing vessel 30 is provided with openings 33A and 33B at positions respectively corresponding to the coating modules COT11 and the COT12. The main arm A13 carries a wafer W to and receives a wafer W from the coating modules COT11 and COT12 through the openings 33A and 33B.

A shelf unit U12 is disposed opposite to the coating unit 31 with respect to the carrying area R1. The shelf unit U12 has processing modules arranged in, for example, two layers and four rows. The processing modules shown in FIGS. 4 and 5 are those for carrying out pretreatments to which a wafer W is subjected before the same is processed by the coating unit 31 and for carrying out posttreatments to which a wafer is subjected after the same has been processed by the coating unit 31. The processing modules include heating and cooling modules LHP for heating a wafer W coated with a resist solution film and cooling the heated wafer W, temperature adjusting modules CPL for adjusting the temperature of a wafer W to a predetermined temperature, and edge exposure modules WEE.

The heating and cooling module LHP is provided with a heating plate 34 for heating a wafer W supported thereon, and a cooling plate 35 serving also as a carrying arm. The cooling plate 35 transfers a wafer W between the main arm A13 and the heating plate 34. The heating and cooling module LHP is formed by combining a heating module and a cooling module. A heating module and a cooling module may be separately included in the shelf unit U12 instead of the heating and cooling module LHP. The temperature adjusting module CPL is provided, for example, with a water-cooled cooling plate.

Figure 4:
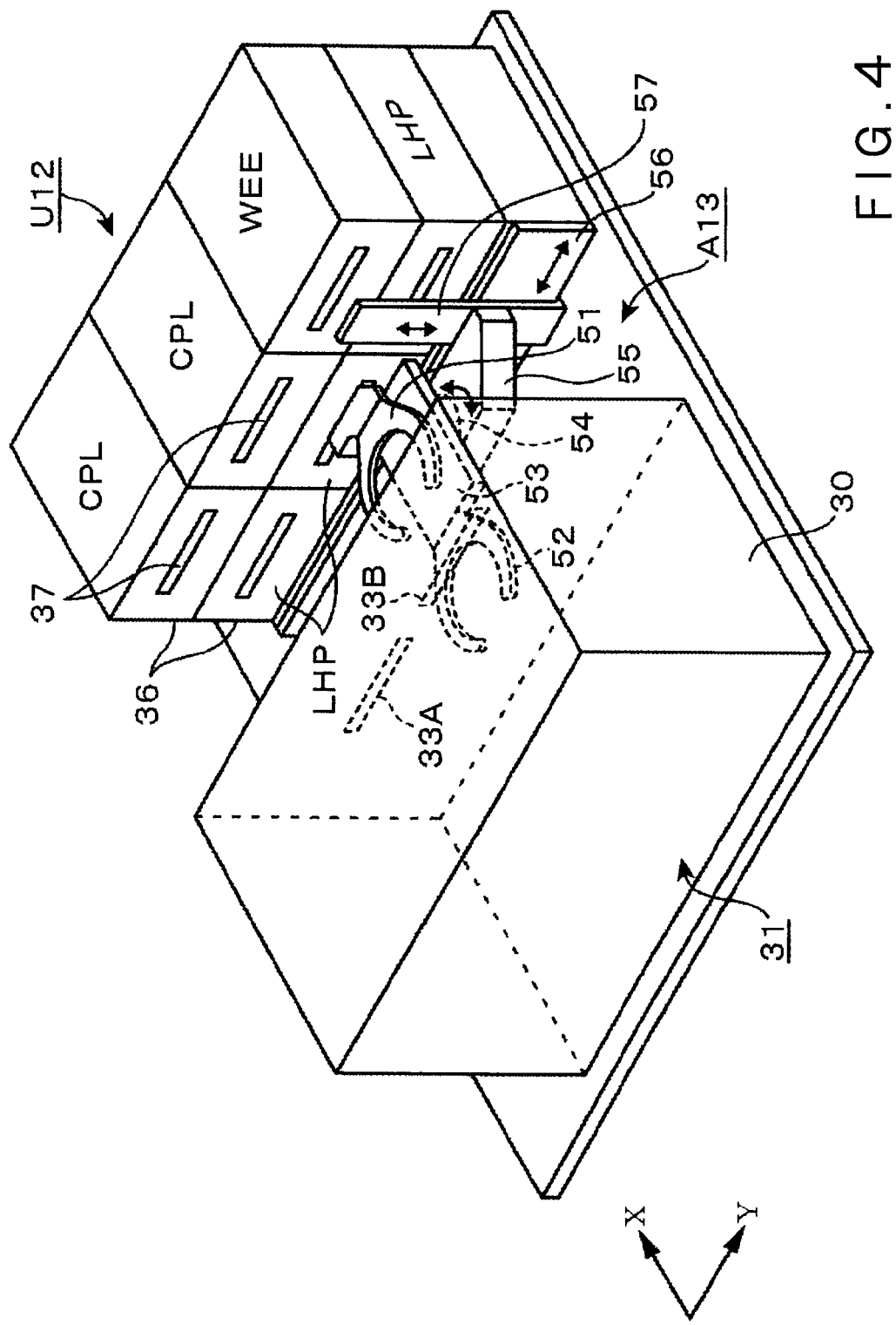
FIG. 4 is a perspective view of unit blocks of a COT1 layer included in the coating and developing system in the first embodiment.

As shown in FIG. 4, each of those modules including the heating and cooling modules LHP and the temperature adjusting modules CPL is contained in a processing vessel 36 having a front wall facing the carrying area R1 and provided with an opening 37 through which a wafer W is carried into and out of the processing vessel 36. The shelf unit U11 of the COT1 layer B13 has a transfer module TRS13 accessible by a transfer arm D1. The transfer module TRS13 has a transfer stage provided with, for example, three support projections for supporting a wafer W thereon. The three support projections are arranged so as not to interfere with the main arm A13 and the transfer arm U1 when they move into the transfer module TRS13. The transfer arm D1 or the main arm A13 moves vertically relative to the projections to transfer a wafer W between the transfer module TRS13, and the transfer arm D1 or the main arm A13. Transfer modules of the present invention that will be mentioned below are the same in construction as the transfer module TRS13, and transfer arms that will be mentioned below are the same in construction as the transfer arm D1.

The main arm A13 will be described. The main arm A13 can transfer a wafer W to and can receive a wafer W from all the modules in the COT1 layer, namely, places where a wafer W is placed, such as the coating modules COT11 and COT12, the transfer module TRS13 of the shelf unit U11, and the processing modules of the shelf unit U12. The main arm A13 can move forward and backward, can move vertically, can turn about a vertical axis and can move in directions parallel to the Y-axis.

Figure 5:
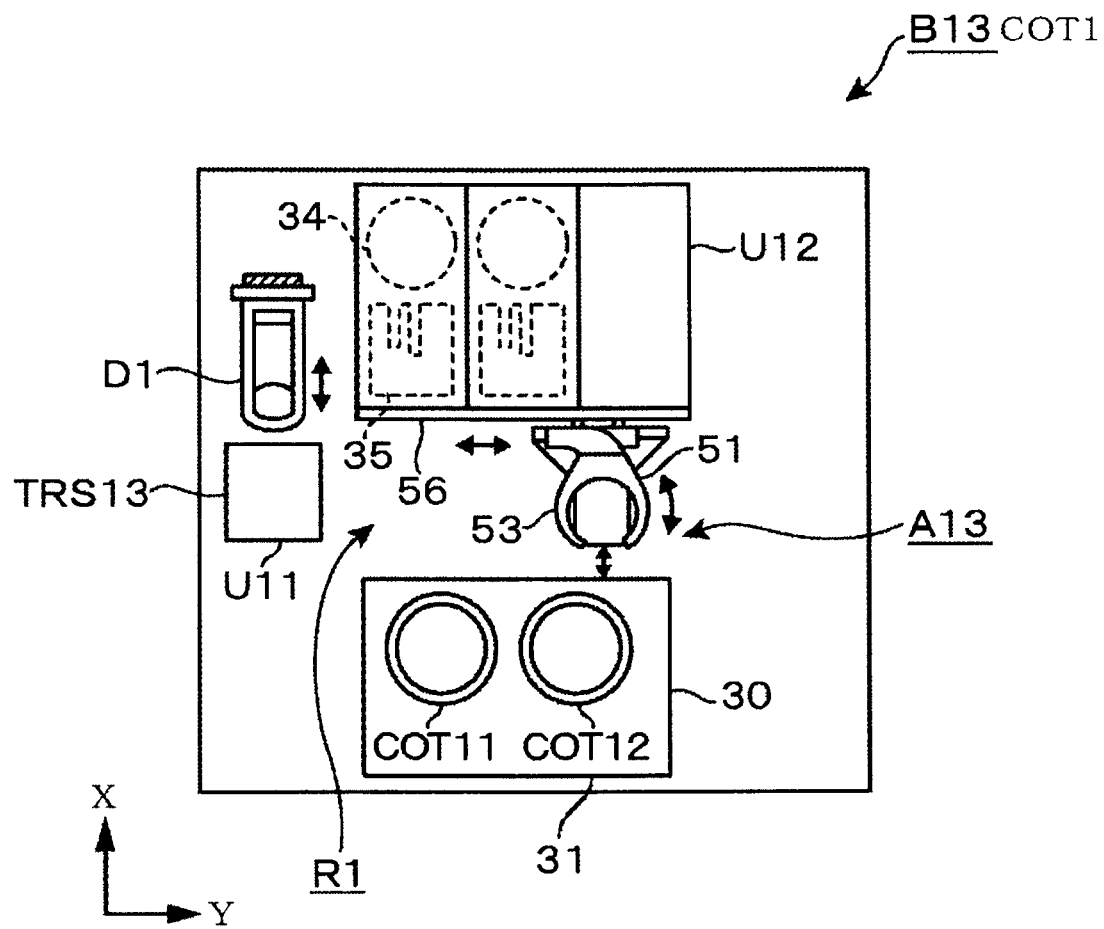
FIG. 5 is a plan view of the unit blocks of the COT1 layer shown in FIG. 4.

Referring to FIGS. 4 and 5, the main arm A13 has two support arms 51 and 52 on which peripheral areas of the back surface of a wafer W are seated. The support arms 51 and 52 can individually move forward and backward on a base plate 53. The base plate 53 is supported on a traveling base 55 so as to be turned about a vertical axis by a turning mechanism 54. Shown also in FIGS. 4 and 5 are a guide rail 56 extended along the length of the carrying area R1 parallel to the Y-direction, a vertical guide rail 57 along which the traveling base 55 move vertically. A lower end part of the vertical guide rail 57 extends vertically down below the guide rail 56. The vertical guide rail 57 moves longitudinally parallel to the Y-direction along the guide rail 56 to move the traveling base 55 longitudinally along the carrying area R1. The vertical guide rail 57 connects to the traveling base 55 at a position separated by a distance from a position where the support arms 51 and 52 move forward and backward to avoid the vertical guide rail 57 interfering with the support arms 51 and 52.

Other unit blocks will be briefly described. The BCT1 layer B12 (hereinafter, referred to as "BCT1 layer") is similar in construction to the COT1 layer. The BCT1 layer B12 has an antireflection film forming unit including, for example, two antireflection film forming modules BCT as wet-processing modules for forming an antireflection film by applying a coating solution for forming the antireflection film to a wafer W. A shelf unit U12 includes heating and cooling modules LHP for heating a wafer processed by an antireflection film forming process on a heating plate by a heating process and cooling the heated wafer W by a cooling plate by a cooling process, and temperature adjusting modules CPL for adjusting the temperature of a wafer W to a predetermined temperature. The shelf unit U11 has a transfer module TRS12 disposed so that a transfer arm D1 can access the transfer module TRS12. The main arm A12 carries a wafer W between each of the modules of the shelf units U11 and U12, and each of the antireflection film forming modules BCT.

Figure 6:
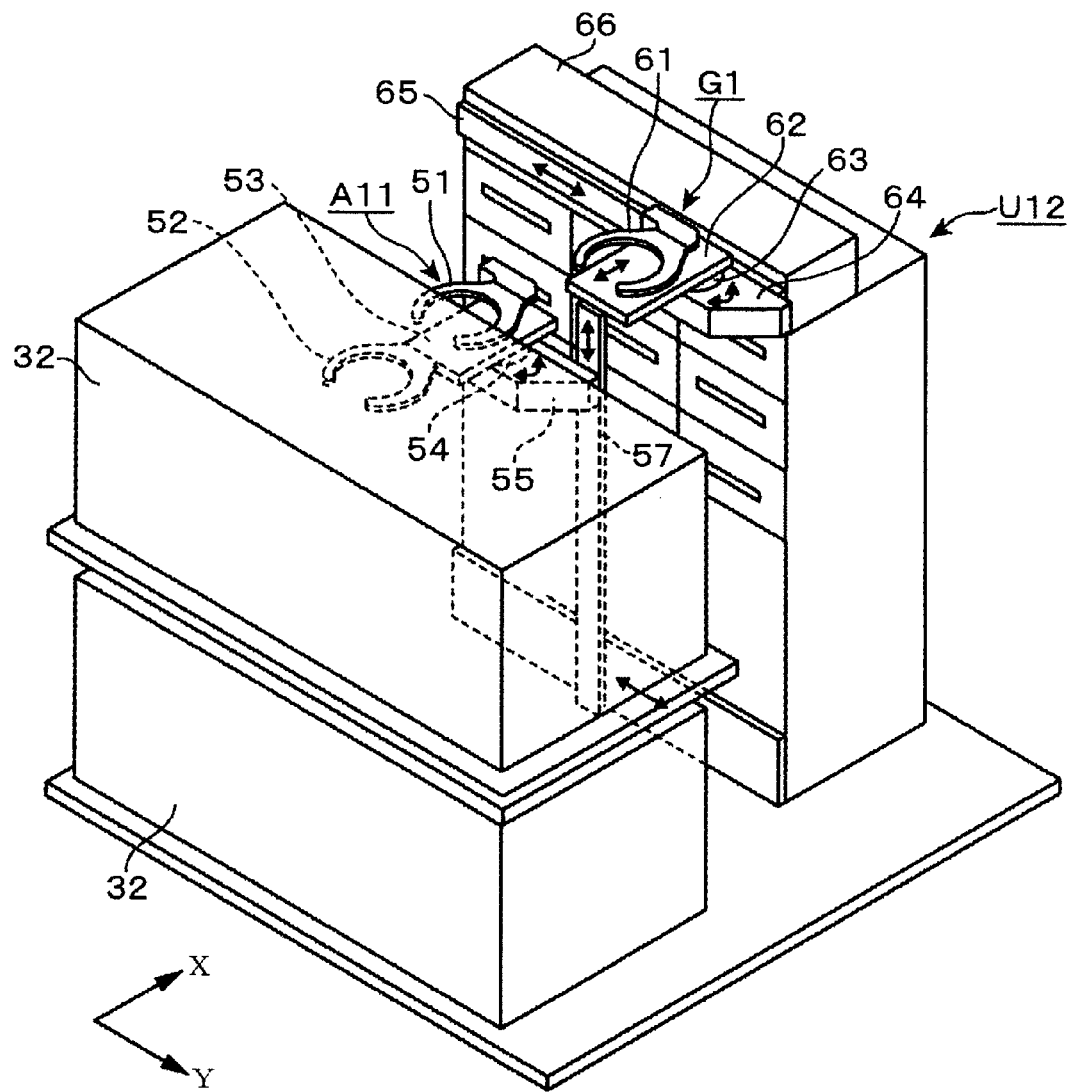
FIG. 6 is a perspective view of unit blocks of a DEV1 layer included in the coating and developing system in the first embodiment.

Referring to FIGS. 1, 3 and 6, the DEV1 layer B11 (hereinafter referred to as "DEV1 layer") is substantially similar to the COT1 layer, except that the DEV1 layer includes a shelf unit U12 having processing modules arranged in three layers and three rows, and a shuttle arm G1. Developing units 32 for processing a wafer W by a developing process using a developer are stacked in two layers. Each of the developing units 32 has, for example, two developing modules DEV11 and DEV12, namely, wet-processing modules. A shelf unit U12 is provided with a heating module PEB, namely, postexposure baking module for processing a wafer W processed by an exposure process by a heating process, a cooling module COL for adjusting the temperature of a wafer W processed by the heating module PEB to a predetermined temperature, heating modules POST for processing a wafer W processed by the developing process by a heating process to dry the wafer W, namely, postbaking modules, and temperature adjusting modules CPL for adjusting the temperature of a wafer W processed by the heating module POST to a predetermined temperature. The antireflection film forming unit and the developing unit 32 are substantially similar in construction to the coating unit 31.

The shelf unit U11 is provided with transfer modules TRS10 and TRS11, namely, transfer units. The transfer module TRS10 is exclusively for the shuttle arm G1. The transfer module TRS10 is an inlet and outlet transfer module. The main arm A11 carries a wafer W to and receives a wafer W from the modules of the shelf units U11 and U12, and the developing modules DEV11 and DEV12.

The shuttle arm G1 will be described with reference to FIG. 6. The shuttle arm G1 is a direct carrying device exclusively for carrying a wafer W between the transfer module TRS10, namely, an inlet and outlet unit of the first processing block S2, and a transfer module TRS20, namely, an inlet and outlet unit of the second processing block S3 disposed behind and connected to the first processing block S2.

As shown in FIG. 6, the shuttle arm G1 has a holding arm 61 capable of supporting a peripheral part of a wafer W thereon and of moving forward and backward on a base plate 62. The base plate 62 is supported on a traveling base 64 so as to be turned about a vertical axis by a turning mechanism 63. The traveling base 64 moves in the direction of the length of the carrying area R1 along a guide rail 65 extended along the length of the carrying area R1 parallel to the Y-direction and supported on a support member 66 of as to face the carrying area R1. Thus the shuttle arm G1 carries a wafer W between the transfer module TRS10 of the first processing block S2 and the transfer module TRS20 of the second processing block S3 adjacent to the first processing block S2.

The second processing block S3 is surrounded by a box 25. The second processing block S3 is built, similarly to the first processing block S2, by stacking up three unit blocks B21 to B23, namely, a developing layer (DEV2 layer) B21, an antireflection film forming layer (BCT layer) B22 and a coating layer (COT2 layer) B23, in that order. The DEV2 layer B21 (hereinafter, referred to as "DEV2 layer"), the BCT2 layer B22 (hereinafter, referred to as "BCT2 layer), and the COT2 layer B23 (hereinafter, referred to as COT2 layer") are similar in construction to the DEV1, layer, the BCT1 layer and the COT1 layer of the first processing block S2, respectively.

A shelf unit U21 is disposed in a front area, adjacent to the first processing block S2, in the second processing block S3. The shelf unit U21 is a transfer unit assemblage having transfer units arranged in layers. A wafer W is carried to and from the unit blocks of the second processing block S3 through the transfer units of the shelf unit U21. The transfer units of the shelf unit U21 are accessible by main arms A21 to A23 included in the unit blocks B21 to B23, and a transfer arm D2.

In the COT2 layer, a main arm A23 carries a wafer W to and from two coating modules COT, a transfer module TRS23 included in the shelf unit U21, and modules included in a shelf unit U22. In the BCT2 layer, a main arm A22 carries a wafer W to and from two antireflection film forming modules BCT, a transfer module TRS22 included in the shelf unit U21, and the modules of the shelf unit U22. In the DEV 2 layer, a main arm A21 carries a wafer W to and from two developing modules DEV, transfer modules TRS20 and TRS21 included in the shelf unit U21, and the modules of the shelf unit U22.

The transfer module TRS20 of the shelf unit U21 is an inlet and outlet transfer unit exclusively for a shuttle arm G2, namely, a direct carrying device. The shuttle arm G2 installed in the second processing block S3 carries a wafer W between the transfer module TRS20 of the second processing block S3 and a transfer module TRS30 included in the third processing block S4 disposed behind and adjacent to the second processing block S3.

The third processing block S4 is surrounded by a box 26. The third processing block S4 is built, similarly to the first processing block S2, by stacking up three unit blocks B31 to B33, namely, a developing layer (DEV3 layer) B31, an antireflection film forming layer (BCT layer) B32 and a coating layer (COT3 layer) B33, in that order. The DEV3 layer B31 (hereinafter, referred to as "DEV3 layer"), the BCT3 layer B32 (hereinafter, referred to as "BCT3 layer), and the COT3 layer B33 (hereinafter, referred to as COT3 layer") are similar in construction to the DEV1, layer, the BCT1 layer and the COT1 layer of the first processing block S2, respectively.

A shelf unit U31 is disposed in a front area, adjacent to the second processing block S3, in the third processing block S4. The shelf unit U31 is a transfer unit assemblage having transfer units arranged in layers. A wafer W is carried to and from the unit blocks of the third processing block S4 through the transfer units of the shelf unit U31. The transfer units of the shelf unit U31 are accessible by main arms A31 to A33 included in the unit blocks B31 to B33, and a transfer arm D3.

In the COT3 layer, a main arm A33 carries a wafer W to and from two coating modules COT, a transfer module TRS33 included in the shelf unit U31, and modules included in the shelf unit U32. In the BCT3 layer, a main arm A32 carries a wafer W to and from two antireflection film forming modules BCT, a transfer module TRS32 included in the shelf unit U31, and modules of a shelf unit U32. In the DEV3 layer, a main arm A31 carries a wafer W to and from two developing modules DEV, transfer modules TRS30 and TRS31 included in the shelf unit U31, and the modules of the shelf unit U32.

The transfer module TRS30 of the shelf unit U31 is an inlet and outlet transfer unit exclusively for a shuttle arm G3, namely, a direct carrying device. The shuttle arm G3 installed in the third processing block S4 carries a wafer W between the transfer module TRS30 of the third processing block S4 and a transfer module TRS40 included in the transfer block S5.

The transfer block S5 is provided with an interface transfer unit through which a wafer W is transferred between the third processing block S4 and the interface block S6. In this embodiment, the transfer unit is the transfer module TRS40 accessible by the shuttle arm G3 of the third processing block S4.

The exposure system S7 is connected to the back end of the transfer block S5 by the interface block S6. An interface arm F is installed in the interface block S6 to transfer a wafer W between the transfer module TRS40 of the transfer block S5, and the exposure system S7. The transfer arm F is movable in longitudinal and vertical directions and is turnable about a vertical axis.

The resist pattern forming system is provided with a controller 100 comprising a computer. The controller 100 controls the management of recipes for the processing modules, the management of recipes specifying the flow of a wafer W, namely, carrying routes, processes to be executed by the processing modules, driving operations for driving the main arms A11 to A13, and A21 to A23, the transfer arm C, the transfer arms D1 to D3, shuttle arms G1 to G3, and the interface arm F. The controller 100 is provided with a storage device for storing programs, such as computer programs. The storage device stores programs, namely, pieces of software, including a set of instructions specifying the general operations of the resist pattern forming system, namely, procedures of processes to be executed by the processing modules, and carrying operations for carrying a wafer W. The controller 100 reads those programs from the storage device and controls the general operations of the resist pattern forming system according to the programs. The programs are stored in a storage medium, such as a flexible disk, a hard disk, a compact disk, a magnetooptical disk or a memory card, and the storage medium is held in the storage device.

Figure 7:
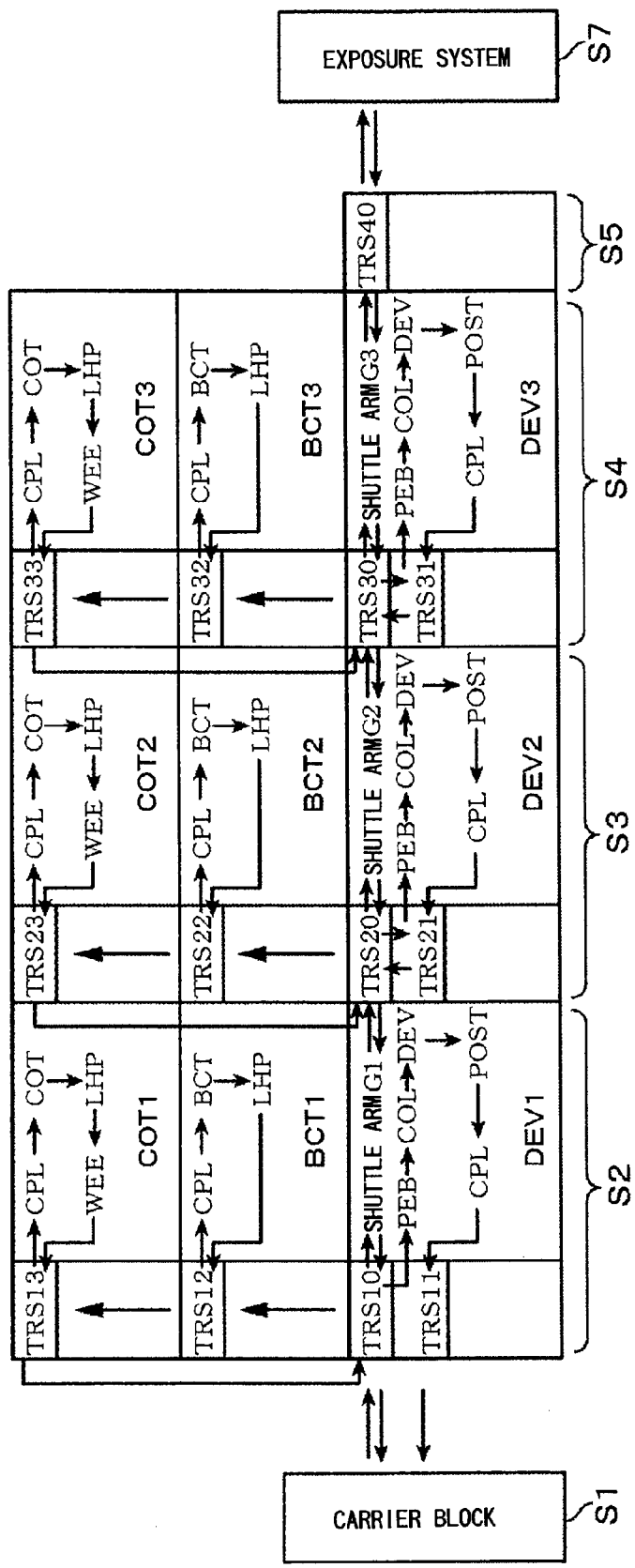
FIG. 7 is a side elevation of assistance in explaining a carrying route along which a wafer W is carried in the coating and developing system in the first embodiment.

A carrying route for carrying a wafer W in the resist pattern forming system to form a resist film on a first antireflection film will be described by way of example with reference to FIG. 7. The controller 100 controls the main arms A11 to A13, A21 to A23, and A31 to A33, the transfer arm C, the transfer arms D1 to D3, the shuttle arms G1 to G3, and the interface arm F on the basis of a recipe specifying a carrying flow (carrying route) to carry the wafer W in the resist pattern forming system.

The carrying route along which a wafer W not yet processed by an exposure process will be described. The transfer arm C takes out a wafer W from a carrier 20 delivered to the carrier block S1 and transfers the wafer W to the transfer module TRS10 of the shelf unit U11. Wafers W transferred to the transfer module TRS10 are distributed to the first processing block S2, the second processing block S3 and the third processing block S4.

A carrying operation for carrying a wafer W to the first processing block S2 will be described. The transfer arm D1 carries the wafer W from the transfer module TRS10 to the transfer module TRS12. Then, the main arm A12 of the BCT1 layer receives the wafer W from the transfer module TRS12. In the BCT1 layer, the main arm A12 carries the wafer W along a route passing the temperature adjusting module CPL, the antireflection film forming module BCT, the heating module LHP, and the transfer module TRS12 of the shelf unit U11 in that order. Thus an antireflection film is formed on a surface of the wafer W.

Then, the transfer arm D1 carries the wafer W from the transfer module TRS12 to the transfer module TRS13. Then, the main arm A13 carries the wafer W to the COT1 layer. In the COT1 layer, the wafer W is carried along a route passing the temperature adjusting module CPL, the coating module COT, the heating module LHP, the edge exposure module WEE, and the transfer module TRS13. Thus a resist film is formed on the antireflection film.

Then, transfer arm D1 carries the wafer W from the transfer module TRS13 to the transfer module TRS10. Then, the wafer W is carried along a carrying route passing the shuttle arm G1, the transfer module TRS20, the shuttle arm G2, the transfer module TRS30, the shuttle arm G3, and the transfer module TRS40. Then, the interface arm F carries the wafer from the transfer module TRS40 to the exposure system S7 to process the wafer W by a predetermined exposure process.

When a wafer W is carried to the second processing block S3, the shuttle arm G1 carries the wafer W from the transfer module TRS10 to the transfer module TRS20. Then, the wafer W is carried along a route passing the transfer arm D2, the transfer module TRS22, the main arm A22 of the BCT2 layer, and the BCT2 layer to form an antireflection film on the wafer W. Operations for carrying the wafer W in the BCT2 layer are the same as those for carrying a wafer W in the BCT1 layer.

Then, the wafer W is carried along a route passing the main arm A22, the transfer module TRS22, the transfer arm D2, the transfer module TRS23, the main arm A23 of the COT2 layer to the COT2 layer to form on the antireflection film in the COT2 layer. Operations for carrying the wafer W in the COT2 layer are the same as those for carrying a wafer W in the COT1 layer.

Subsequently, the wafer W is carried along a carrying route passing the main arm A23, the transfer module TRS23, the transfer arm D2, the transfer module TRS20, the shuttle arm G2, the transfer module TRS30, the shuttle arm G3, the transfer module TRS40, the interface arm F and the exposure system S7 to process the wafer W by a predetermined exposure process.

A wafer W is carried from the transfer module TRS10 to the third processing block S4 along a carrying route passing the shuttle arm G1, the transfer module TRS20, the shuttle arm G2, and the transfer module TRS30. Subsequently, the wafer W is carried along a carrying route passing the transfer arm D3, the transfer module TRS32, the main arm A32 of the BCT3 layer, and the BCT3 layer to form an antireflection film on a surface of the wafer W. The wafer W is carried in the BCT3 layer like a wafer is carried in the BCT1 layer.

Subsequently, the wafer W is carried along a route passing the main arm A32, the transfer module TRS32, the transfer arm D3, the transfer module TRS33, the main arm A33 of the COT3 layer, and the COT3 layer to form a resist film on the antireflection film. The wafer W is carried in the COT3 layer like a wafer is carried in the COT1 layer.

Then, the wafer W is carried along a carrying route passing the main arm A33, the transfer module TRS33, the transfer arm D3, the transfer module TRS30, the shuttle arm G3, the transfer module TRS40, and the interface arm F to the exposure system S7 to process the wafer W by a predetermined exposure process.

Carrying routes along which the wafer W processed by the exposure process is carried to process the wafer W by the first processing block S2 will be described. The transfer arm F carries the wafer W processed by the exposure process to the transfer module TRS40. Then, the wafer W is carried along a carrying route passing the shuttle arm G3, the transfer module TRS30, the shuttle arm G2, the transfer module TRS20, and the shuttle arm G1 to the transfer module TRS10 of the first processing block S2. Then, the transfer arm D1 carries the wafer W to the transfer module TRS11, and the main arm A11 carries the wafer W to the DEV1 layer.

The wafer W is carried in the DEV1 layer along a carrying route passing the heating module PEB, the cooling module COL, the developing module DEV, the heating module POST, the temperature adjusting module CPL, and the transfer module TRS11 of the shelf unit U11 to process the wafer W by a predetermined developing process. Then, the transfer arm C carries the wafer W processed by the developing process from the transfer module TRS11 to return the wafer W into the carrier 20, from which the wafer was taken out, held in the carrier block S1.

When the wafer W is subjected to a developing process in the second processing block S3, the transfer arm F carries the wafer W processed by the exposure process to the transfer module TRS40. Then, the wafer W is carried along a carrying route passing the shuttle arm G3, the transfer module TRS30, the shuttle arm G2, the transfer module TRS20, and the transfer arm D2 to the transfer module TRS21. Then, the main arm A21 carries the wafer W to the DEV2 layer. The wafer W is carried in the DEV2 layer like a wafer is carried in the DEV1 layer to process the wafer W by a predetermined developing process. Then, the wafer W processed by the developing process is carried along a carrying route passing the transfer module TRS21, the transfer arm D2, the transfer module TRS20, and the shuttle arm G1 to the transfer module TRS10. Then, the transfer arm C carries the wafer W processed by the developing process from the transfer module TRS10 to return the wafer W into the carrier 20, from which the wafer was taken out, held in the carrier block S1.

When the wafer W is subjected to a developing process in the third processing block S4, the transfer arm F carries the wafer W processed by the exposure process to the transfer module TRS40. Then, the wafer W is carried along a carrying route passing the shuttle arm G3, the transfer module TRS30, and the transfer arm D3 to the transfer module TRS31. Then, the main arm A31 carries the wafer W to the DEV3 layer. The wafer W is carried in the DEV3 layer like a wafer is carried in the DEV1 layer to process the wafer W by a predetermined developing process. Then, The wafer W processed by the developing process is carried along a carrying route passing the transfer module TRS31, the transfer arm D3, the transfer module TRS30, the shuttle arm G2, the transfer module TRS20, and the shuttle arm G1 to the transfer module TRS10. Then, the transfer arm C carries the wafer W processed by the developing process from the transfer module TRS10 to return the wafer W into the carrier 20, from which the wafer was taken out, held in the carrier block S1.

The resist pattern system can be easily designed according to a desired throughput, and can be easily built so as to achieve a desired throughput. Since the processing station includes the plurality of processing blocks, the number of the processing blocks is increased when a high throughput is desired, and the number of the processing blocks is reduced when a desired throughput is not very high. Since the throughput of the resist pattern forming system is adjusted by adjusting the number of the processing blocks, the resist pattern forming system can readily cope with the change of the throughput.

Since the design of the processing block does not need to be changed according to a desired throughput, the resist pattern forming system can be easily designed as compared with s case requiring changing the numbers of the wet-processing modules and the stacked unit blocks, a resist pattern forming system capable of achieving a desired throughput can be easily manufactured by manufacturing identical processing blocks.

Each of the unit blocks of the processing block is built by assembling two wet-processing modules, and numbers of processing modules corresponding to the number of the wet-processing modules. Although the throughput of one processing block is lower than that of a conventional processing block provided with three wet-processing modules, the processing block can be formed in a small size. Thus it is possible to meet a desired throughput flexibly, limiting the enlargement of a floor space necessary for installing the system to the least extent. A desired throughput can be achieved and the immoderate enlargement of the system can be prevented by assembling a number of small processing blocks necessary for achieving a desired throughput.

When a wafer W is to be carried to the processing block in the foregoing system, a wafer W is carried first to the inlet and outlet unit, and then the wafer W is carried from the inlet and outlet unit to the unit block of the processing block. Therefore, even if a plurality of processing blocks are connected, a carrying program can be easily created. When a wafer W is to be processed by the processing block S2 (S3 or S4), the wafer W is carried from the carrier block S1 to the transfer module TRS10 (TRS20 or TRS30), namely, the inlet and outlet unit, of the processing block S2 (S3 or S4), the wafer W is transferred from the transfer module TRS10 (TRS20 or TRS30) to the BCT1 layer (the BCT2 layer or the BCT3 layer), and a resist film is formed on the wafer W by the COT1 layer (the COT2 layer or the COT3 layer) of the processing block S2 (S3 or S4).

The wafer W thus provided with the resist film is returned to the transfer module TRS10 (TRS20 or TRS30) of the processing block S2 (S3 or S4), and the wafer W is carried to the transfer module TRS40 by the shuttle arms G1 to G3. The wafer W processed by the exposure process is carried to the transfer module TRS10 (TRS20 or TRS30) of the processing block S2 (S3 or S4) by the shuttle arms G1 to G3, and then the wafer W is carried to the DEV1 layer (the DEV2 layer or the DEV3 layer)

When a wafer W is transferred from the carrier block S1 or the interface block S6 to the processing block S2 (S3 or S4), the wafer W is carried invariably to the transfer module TRS10 (TRS20 or TRS30), namely, the inlet and outlet unit, and the wafer W is carried from the inlet and outlet unit to the predetermined unit block of the processing block S2 (S3 or S4). The processing blocks S2 to S4 are the same in construction and wafer carrying routes in the processing blocks S2 to S4 are identical.

Although different ones of the shuttle arms G1 to G3 are used to carry wafers W along the somewhat different routes to the transfer modules TRS10 TRS20 and TRS30, namely, inlet and outlet units of the processing blocks S2 to S4, respectively, carrying routes in the processing blocks S2 to S4 are identical. Therefore, the carrying program is easily to create. Since the processing blocks S2 to S4 operate individually to process wafers W delivered thereto, the carrying program is easy to create. Since a wafer is transferred between the adjacent processing blocks through the inlet and outlet units, and the inlet and outlet units are accessible by only the shuttle arms G1 to G3. Since the wafer W can be thus transferred between the inlet and outlet units regardless of the main arms of the processing blocks, the carrying program is easily to create.

Figure 8:
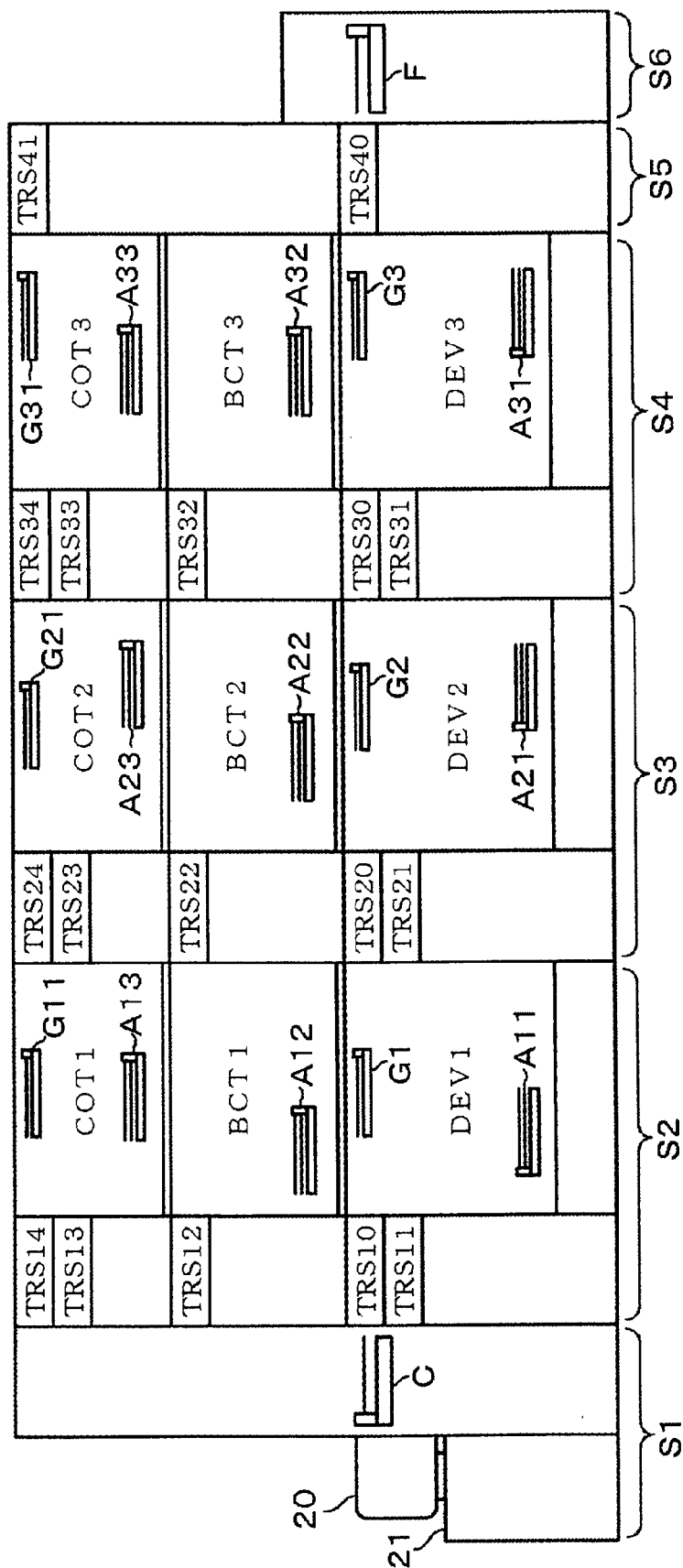
FIG. 8 is a side elevation of a coating and developing system in a second embodiment according to the present invention.
Figure 9:
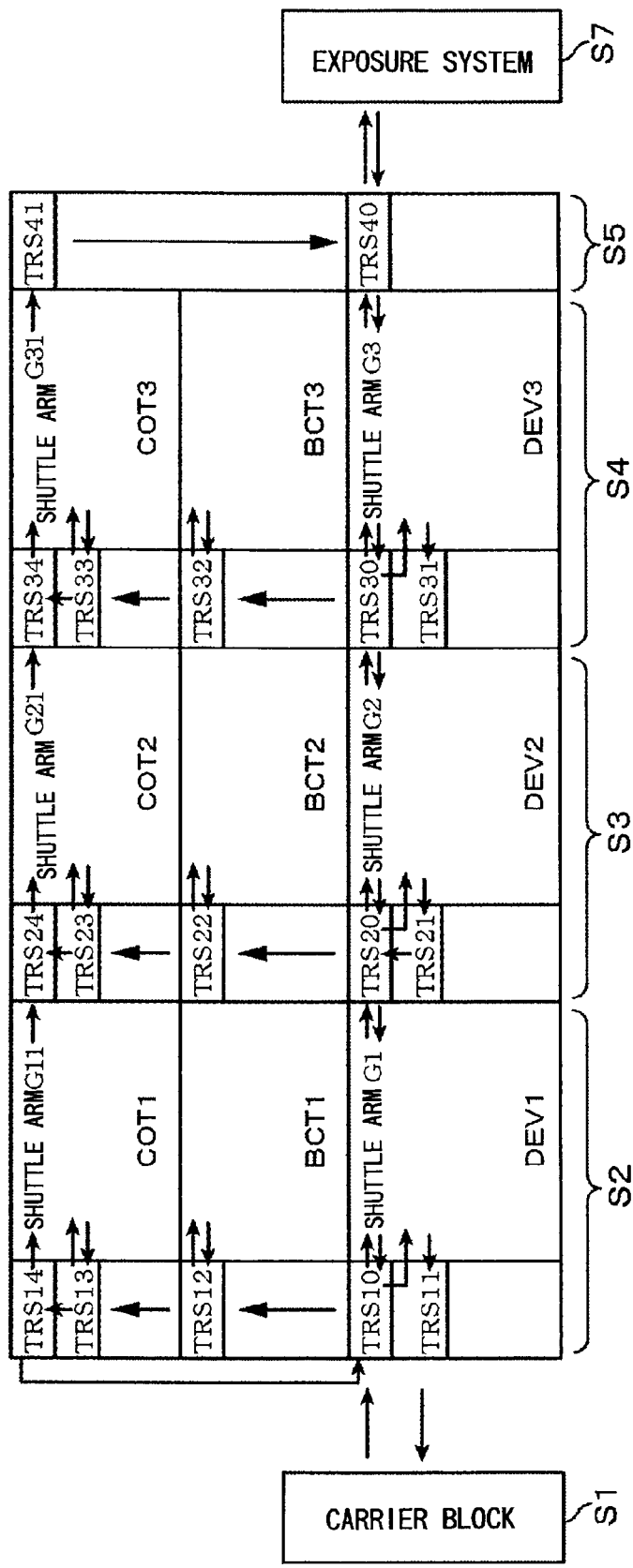
FIG. 9 is a side elevation of assistance in explaining a carrying route along which a wafer W is carried in the coating and developing system shown in FIG. 8.
Figure 10:
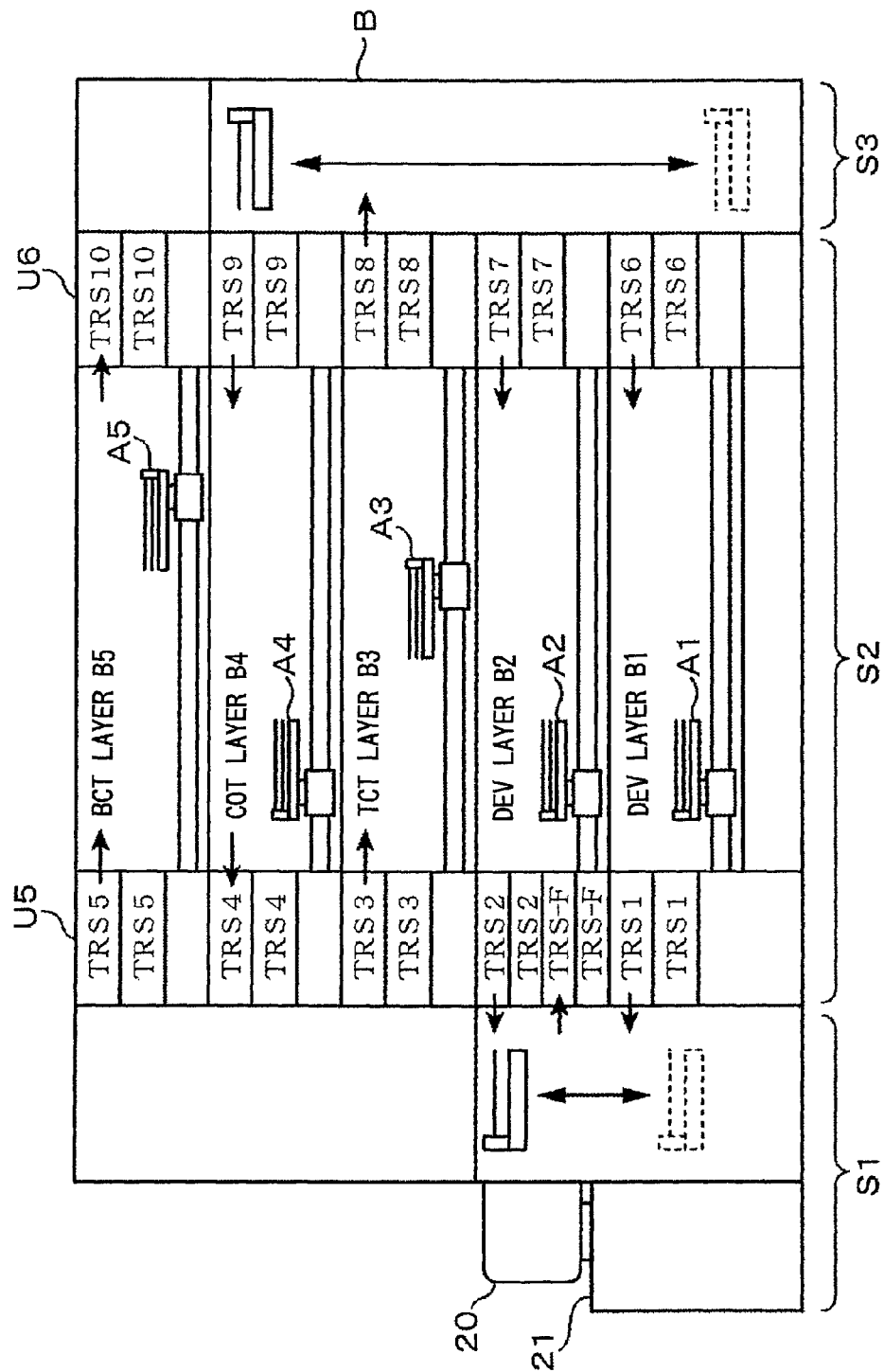
FIG. 10 is a side elevation of a conventional coating and developing system.

A resist pattern forming system in a second embodiment according to the present invention will be described with reference to FIGS. 8 and 9. The resist pattern forming system in the second embodiment differs from the resist pattern forming system in the first embodiment in that processing blocks S2 to S4 are provided with shuttle arms G11 to G31 in their upper layers, and transfer modules TRS14, TRS24 and TRS34 exclusively for the shuttle arms, respectively, a transfer block S5 is provided with a transfer module TRS41 for the shuttle arm G31, and a transfer arm E is used for transferring a wafer W between the transfer modules TRS40 and TRS41. Transfer arms D1 to D3 included in the processing blocks S2, S3 and S4 transfer a wafer W to The transfer modules TRS14, TRS24 and TRS34, respectively. The transfer arms, similarly to the foregoing transfer arms D1 to D3, can move forward and backward and can move vertically. The shuttle arms G11, G21 and G31 are direct carrying devices, and the transfer modules TRS14, TRS24 and TRS34 are inlet and outlet transfer units respectively exclusively for the shuttle arms G11, G21 and G31.

Carrying routes along which a wafer W is carried in the resist pattern forming system will be described with reference to FIG. 9. A transfer arm C takes out wafers W from a carrier 20 delivered to a carrier block S1 and transfers the wafers W to a transfer module TRS10 included in a shelf unit U11. Then, the wafers W are delivered to the first processing block S2, the second processing block S3 and the third processing block S4, respectively. The wafer W delivered to the first processing block S2 from the transfer module TRS10 is carried along a carrying route passing the transfer arm D1, a transfer module TRS12, a main arm A12 included in a BCT1 layer, the BCT1 layer, the transfer module TRS12, the transfer arm D1, a transfer module TRS13, a main arm A13 included in a COT1 layer, the COT1 layer, the transfer module TRS13, the transfer arm D1, the transfer module TRS14, the shuttle arm G11, the transfer module TRS24, the shuttle arm G21, the transfer module TRS34, the shuttle arm G31, the transfer module TRS41, a transfer arm, the transfer module TRS40 and an interface arm F to an exposure system S7.

The wafer W delivered to the second processing block S3 from the transfer module TRS10 is carried along a carrying route passing the shuttle arm G1, a transfer module TRS20, the transfer arm D2, a transfer module TRS22, a main arm A22 included in a BCT2 layer, the BCT2 layer, a transfer module TRS22, the transfer arm D2, a transfer module TRS23, a main arm A23 included in a COT2 layer, the COT2 layer, a transfer module TRS23, the transfer arm D2, a transfer module TRS24, the shuttle arm G21, the transfer module TRS34, the shuttle arm G31, the transfer module TRS41, the transfer arm E, the transfer module TRS40 and the interface arm F to the exposure system S7.

The wafer W delivered to the third processing block S4 from the transfer module TRS10 is carried along a carrying route passing the shuttle arm G1, the transfer module TRS20, the shuttle arm G2, a transfer module TRS30, the transfer arm D3, a transfer module TRS32, a main arm A32 included in a BCT3 layer, the BCT3 layer, the transfer module TRS32, the transfer arm D3, a transfer module TRS33, a main arm A33 included in the COT3 layer, the COT3 layer, the transfer module TRS33, the transfer arm D3, a transfer module TRS34, the shuttle arm G31, the transfer module TRS41, a transfer arm, the transfer module TRS40 and the interface arm F to the exposure system S7. The wafers W processed by an exposure process are carried along carrying routes similar to those along which wafers W are carried in the resist pattern forming system in the first embodiment.

The resist pattern forming system can be easily designed and manufactured so as to achieve a desired throughput, is capable of readily achieving a desired throughput, and a carrying program for the resist pattern forming system can be easily created. Since the shuttle arms G11, G21 and G31 are used for carrying wafers W forward from the carrier block S1 to the interface block S6, and the shuttle arms G1 to G3 are used for carrying wafers W backward from the interface block S6 to the carrier block S1, loads on the shuttle arms are reduced and the throughput of the resist pattern forming system can be improved.

The present invention is applicable to forming only a resist film, and to forming an antireflection film on a resist film. To form an antireflection film on a resist film, an antireflection film forming unit block for forming the antireflection film is necessary. This antireflection film forming unit block is similar in construction to the antireflection film forming unit block for forming an antireflection film under a resist film. The present invention is applicable to forming a resist film an antireflection film underlying the resist film, and an antireflection film overlying the resist film. In such a case a processing block is built by stacking up a developing unit block, a resist film forming unit block, an antireflection film forming unit block for forming the antireflection film underlying the resist film, and an antireflection film forming unit block for forming the antireflection film overlying the resist film in layers. According to the present invention, the unit blocks of the processing may be stacked up in any order, provided that the processing block is provided with a film forming unit block and a developing unit block.

The shelf units U12, U22 and U32 may be provided with processing modules other than the abovementioned processing modules. The numbers of the transfer modules as the transfer units of the shelf units U12, U22 and U32 may be increased, and the shelf units U12, U22 and U32 may be provided with modules capable of serving as a temperature adjusting mechanism and a transfer unit. The shelf units U11, U12, U21, U22, U31 and U32 may be provided with hydrophobicity imparting modules and inspection units for measuring the thickness of a film and inspecting a wafer W for warp, respectively.

The present invention is applicable not only to a coating and developing system for processing a semiconductor wafer, but also to a coating and developing system for processing a substrate, such as a glass substrate for a liquid crystal display, namely, an LCD substrate.

What is claimed is:

1. A coating and developing system, for forming films including a resist film on a substrate carried in a carrier delivered to a carrier block by film forming unit blocks, carrying the substrate through an interface block to an exposure system, processing the substrate processed by an exposure process and returned from the exposure system through the interface block by a developing process, transferring the substrate processed by the developing process to the carrier block, each of film forming unit blocks and developing unit blocks including a wet-processing module for applying a chemical solution to a substrate, a heating module for heating a substrate, a cooling module for cooling a substrate, substrate carrying means for carrying a substrate to and from those modules in the unit block, said coating and developing system comprising:

a processing station provided with at least two processing blocks of the same construction each built by stacking up a plurality of unit blocks including a film forming unit block and a developing unit block, arranged longitudinally contiguously between the carrier block on a front side and the interface block on a back side along a substrate carrying passage along which a substrate is carried backward from the carrier block toward the interface block;

transfer unit blocks disposed in the processing blocks, respectively, on the front side of the unit blocks, each built by stacking up, in layers, transfer units so as to correspond to the unit blocks, respectively, to transfer a substrate from one to another of the unit blocks therethrough by transferring a substrate to and receiving a substrate from substrate carrying means included in the unit blocks;

vertically movable transfer arms installed in the processing blocks, respectively, to carry a substrate to and from the transfer units of the transfer unit blocks;

first inlet and outlet transfer units, included in the transfer unit blocks, for transferring a substrate between the carrier block and the processing block or between the adjacent ones of the processing blocks, and capable of transferring a substrate to and receiving a substrate from the transfer arms, respectively, the first inlet and outlet transfer units being one of the transfer units, positioned at a first height of the transfer unit block;

second inlet and outlet transfer units, included in the transfer unit blocks, for transferring a substrate between the carrier block and the processing block or between the adjacent ones of the processing blocks, and capable of transferring a substrate to and receiving a substrate from the transfer arms, respectively, the second inlet and outlet transfer units being one of the transfer units, positioned at a second height different from the first height, of the transfer unit block; and a first direct carrying device and a second direct carrying device, different from the first carrying device, installed in each of the processing blocks, wherein the first direct carrying device carries a substrate, which the films have been formed on and have not been processed by the exposure process, from the first inlet and outlet transfer unit of the processing block to that of the processing block behind and adjacent to the former processing block or to the interface block, and the second direct carrying device carries a substrate processed by the exposure process, from the second inlet and outlet transfer unit of the processing block to that of the processing block in front of and adjacent to the former processing block or from the interface block to the second inlet and outlet transfer unit of the processing block on the most back side, and the second direct carrying device carries a substrate, on which the films have not been formed, from the second inlet and outlet transfer unit of the processing block to that of the processing block behind and adjacent to the former processing block.

2. The coating and developing system as claimed in claim 1, wherein the second inlet and outlet transfer units are positioned higher than the first inlet and outlet transfer units.

3. A coating and developing method, to be carried out by a coating and developing system including a processing station provided with at least two processing blocks of the same construction built by stacking up a plurality of unit blocks including a film forming unit block and a developing unit block, arranged longitudinally contiguously between a carrier block on a front side and an interface block on a back side along a substrate carrying passage along which a substrate is carried backward from the carrier block toward the interface block, for forming films including a resist film on a substrate carried in a carrier delivered to the carrier block by film forming unit blocks, carrying the substrate through the interface block to an exposure system after forming films including a resist film on the substrate, processing the substrate returned through the interface block from the exposure system by a developing process by the developing unit block, and transferring the substrate processed by the developing process to the carrier block, transfer unit blocks disposed in the processing blocks, respectively, on the front side of the unit blocks, each built by stacking up, in layers, transfer units so as to correspond to the unit blocks, respectively, to transfer a substrate from one to another of the unit blocks therethrough by transferring a substrate to and receiving a substrate from a substrate carrying device included in the unit blocks;

first inlet and outlet transfer units, included in the transfer unit blocks, for transferring a substrate between the carrier block and the processing block or between the adjacent ones of the processing blocks, the first inlet and outlet transfer units being one of the transfer units, positioned at a first height, of the transfer unit block;

second inlet and outlet transfer units, included in the transfer unit blocks, for transferring a substrate between the carrier block and the processing block or between the adjacent ones of the processing blocks, the second inlet and outlet transfer units being one of the transfer units, positioned at a second height different from the first height, of the transfer unit block;

said coating and developing method comprising:

transferring a substrate, on which the films have not been formed, from the carrier block directly to the second inlet and outlet transfer unit of the processing block on the most front side;

carrying, by a second direct carrying device, the substrate on which the films have not been formed, from the second inlet and outlet transfer units of the processing block to that of the processing block behind and adjacent to the former processing block;

carrying, by a transfer arm and the second direct carrying device, the substrate from each of the second inlet and outlet transfer units to the film forming unit block of the processing block in which includes the same second inlet and outlet transfer unit, and carrying the substrate on which films have been formed to the first inlet and outlet transfer units of the same processing block;

carrying, by a first direct carrying device, the substrate on which the films have been formed, from the first inlet and outlet transfer units of the processing block to that of the processing block behind and adjacent to the former processing block or to the interface block;

carrying, by the second direct carrying device, the substrate processed by the exposure system from the interface block to the second inlet and outlet transfer unit of the processing block on the most back side;

carrying, by the second direct carrying device, the substrate processed by the exposure system, from the second inlet and outlet transfer unit of the processing block to that of the processing block in front of and adjacent to the former processing block; and carrying, by the transfer arm and the second direct carrying device, the substrate processed by the exposure system, from each of the second inlet and outlet transfer units to the developing unit block included in the processing block.

4. The coating and developing method as claimed in claim 3, wherein the second inlet and outlet transfer units are positioned higher than the first inlet and outlet transfer units.

5. A non-transitory storage medium storing a computer program to be carried out by a coating and developing system that forms films including a resist film on a substrate received from a carrier block and processes the substrate processed by an exposure process by a developing process;

wherein the program includes a set of instructions specifying the steps of the coating and developing method set forth in claim 3.

* * * * *